United States Patent [19]

Tagiri

[11] Patent Number: 5,614,872
[45] Date of Patent: Mar. 25, 1997

[54] SEMICONDUCTOR DEVICE HAVING CR OSCILLATION CIRCUIT AND RESET CIRCUIT

[75] Inventor: Hirokazu Tagiri, Kyoto, Japan

[73] Assignee: Rohm Co., Ltd., Kyoto, Japan

[21] Appl. No.: 564,716

[22] Filed: Nov. 29, 1995

[30] Foreign Application Priority Data

Nov. 30, 1994 [JP] Japan ..................... 6-297654

[51] Int. Cl.$^6$ ............... H03B 5/24; H03K 7/20; H03K 17/30
[52] U.S. Cl. .................. 331/143; 331/64; 331/108 C; 331/111; 327/143
[58] Field of Search .................. 331/64, 108 C, 331/111, 143, 150; 327/142, 143

[56] References Cited

U.S. PATENT DOCUMENTS 4,742,315  5/1988  Schreilechner ............... 331/108 C
5,369,377  11/1994  Beahamida ................... 331/64 X

*Primary Examiner*—David Mis
*Attorney, Agent, or Firm*—Brumbaugh, Graves, Donohue & Raymond

[57] ABSTRACT

In a semiconductor device having a CR oscillation circuit and a reset circuit, the semiconductor device includes a common terminal for constituting the CR oscillation circuit and the reset circuit. A voltage level at which the device falls into a reset state is lower than a low level voltage of an oscillation waveform and the device does not falls into the reset state during oscillation. As a result, the number of terminals of the device can be decreased to permit a larger number of functions to be included in a package having an equal number of pins, and the number of components externally equipped can be decreased to reduce expense of the components and management therefor.

14 Claims, 3 Drawing Sheets

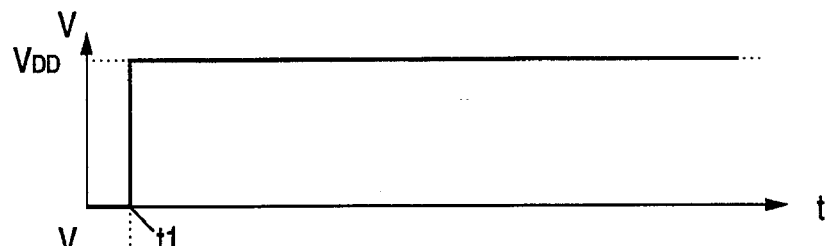
FIG. 2a (VDD)
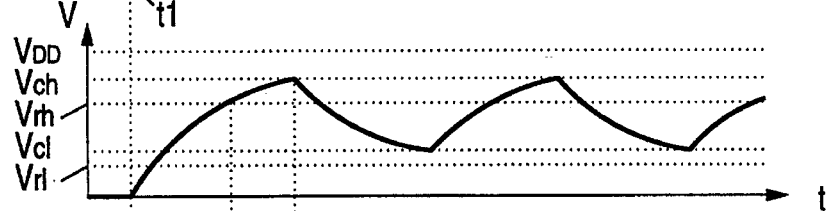
FIG. 2b (L1)
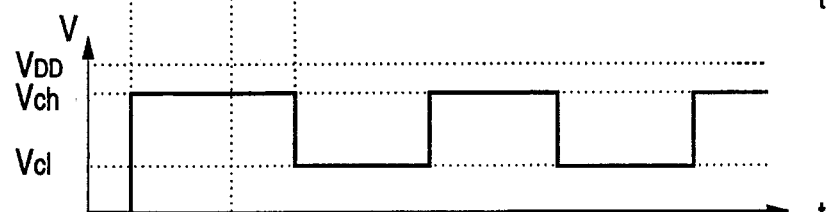
FIG. 2c (L2)
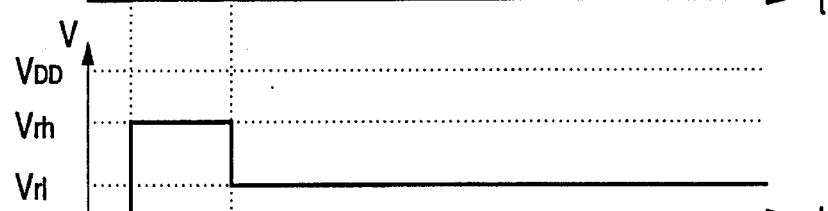
FIG. 2d (L3)
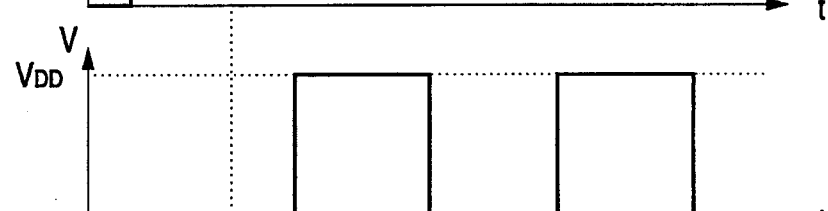
FIG. 2e (CLK)
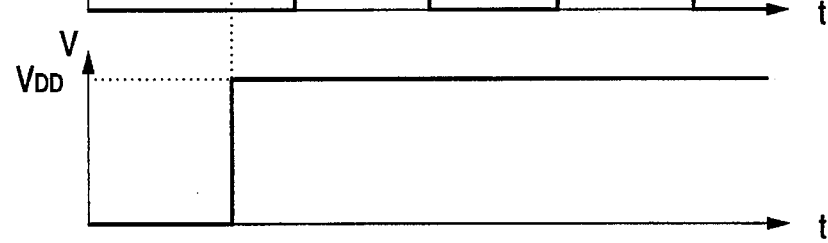
FIG. 2f (RST)

SEMICONDUCTOR DEVICE HAVING CR OSCILLATION CIRCUIT AND RESET CIRCUIT

BACKGROUND OF THE INVENTION

1. Field of the Invention

The present invention relates to a semiconductor device, and more particularly to a circuit configuration of a semiconductor device including a CR oscillation circuit and a reset circuit.

2. Description of the Related Art

Traditionally, where the operating timing for a semiconductor device does not require the clock signal at high accuracy, in many cases, an external CR oscillation circuit with a capacitor and a resistor has been used as an inexpensive and simple oscillating circuit. As a reset signal generating circuit for defining the initial operation at power-on, an external reset circuit with a capacitor and a resistor has been also used.

FIG. 4 shows a circuit configuration of a conventional semiconductor device, i.e., a semiconductor device 1 including a capacitor C1 and a resistor R9 for CR oscillation and a capacitor C2 for generation of a reset signal. The CR oscillation circuit is configured as follows. The junction point of the capacitor C1 and the resistor R9 connected between a reference potential (GND) and a power supply voltage ($V_{DD}$) is connected to a CR oscillation control circuit 2b of the semiconductor device 1 through a terminal T1. An output signal from the CR oscillation control circuit 2b passes through a buffer circuit 5 to provide an internal clock (hereinafter referred to as "CLK") signal for operating the semiconductor device 1. The discharge control of the capacitor C1 by the CR oscillation control circuit 2b permits the CR oscillation.

The reset circuit is configured as follows. One terminal of the capacitor C2 whose the other terminal is connected to the reference potential is connected to a reset control circuit 3b of the semiconductor device 1. An output signal from the reset control circuit 3b passes through a buffer circuit 7 to provide an internal reset (hereinafter referred to as "RST") signal for resetting the semiconductor device 1.

With no voltage applied from the power supply, the capacitor C2 is discharged so that the voltage at a terminal T2 is the reference potential. After power-on, the capacitor C2 is charged by the current flowing through a pull-up resistor (not shown) in the reset control circuit so that the voltage at the terminal T2 boosts gradually. When the voltage at the terminal T2 boosts to exceed a voltage set by the reset control circuit 3b, the reset control circuit 3b converts the level of the RST signal into the high level, thereby releasing the reset state of the semiconductor device 1.

Incidentally, the circuit configurations of the CR oscillation control circuit and the reset control circuit, which are disclosed in some technical literatures, are not described here. When the high accuracy in the oscillation frequency is not required, an oscillation circuit is frequently used in which the resistor 9 is provided within the semiconductor device 1 and only the capacitor C1 is externally provided.

The semiconductor device 1 as shown in FIG. 4 has the following defects. Although the device 1 can be realized by a simple circuit configuration, required are the terminal T1 connecting the capacitor C1 and the resistor R9 for CR oscillation and the terminal T2 connecting the capacitor C2 for generation of the reset signal. This increases the number of components externally equipped and requires the number of terminals for the semiconductor device 1. For this reason, a multi-pin package having a large number of terminals must be used, or otherwise the terminals for other functions must be canceled.

However, this gives rise to many problems. Namely, a large number of components externally equipped increase a substrate area for the external equipment and also cost because of the expense of the components themselves and management expense therefor. Use of a multi-pin package increases the production cost. Cancellation of the terminals for other functions makes it difficult to fulfill the required function sufficiently. Since the timing for generating the reset signal and the timing of the clock signal by oscillation are generated independently, the synchronization must be considered separately.

SUMMARY OF THE INVENTION

One object of the present invention is to provide a semiconductor device which can decrease the number of terminals of the semiconductor device to permit a larger number of functions to be included in a package having an equal number of pins, and decrease the number of components externally equipped to reduce expense of the components and management therefor.

Another object of the present invention is to provide a semiconductor device which can surely operate without taking the timing relation between a clock signal and a reset signal into consideration.

In order to attain the above objects, according to one aspect of the present invention, there is provided a semiconductor device comprising: a CR oscillation circuit; a reset circuit; and a common terminal for constituting the CR oscillation circuit and the reset circuit, wherein a voltage level at which the device falls into a reset state is set to be lower than a low level voltage of an oscillation waveform to prevent the device from falling into the reset state during oscillation.

BRIEF DESCRIPTION OF THE DRAWINGS

The above and other objects and features of the present invention will be more apparent from the following description taken in conjunction the accompanying drawings.

FIGS. 2a to 2f are waveform charts illustrating the operation waveform of the embodiment;

DETAILED DESCRIPTION OF THE PREFERRED EMBODIMENTS

Now, referring to FIGS. 1 to 3, a detailed explanation will be given of embodiments of the present invention. Assuming that in all the FIGS., like reference symbols refer to like circuit elements, the specification avoids repetition of the explanation.

Figure 1:
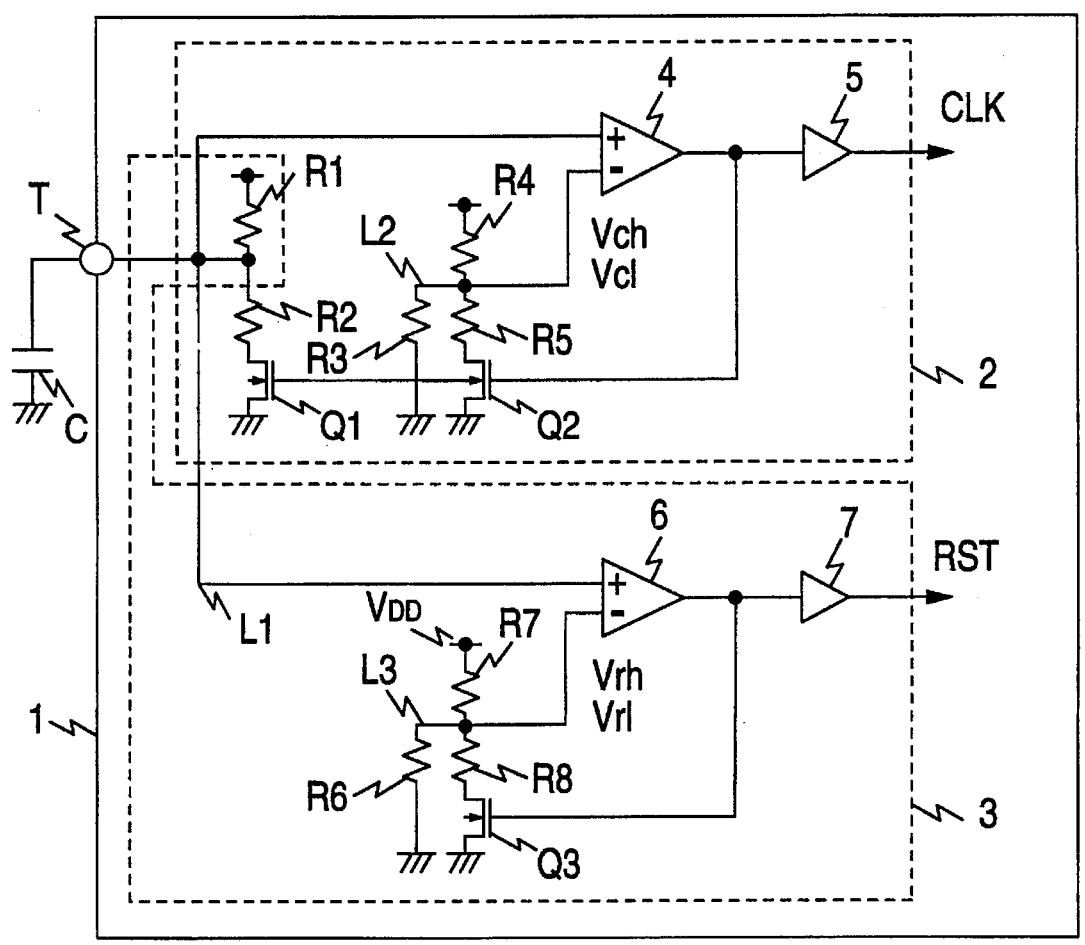
FIG. 1 is a circuit diagram showing one embodiment of the present invention.

FIG. 1 shows an example of the semiconductor device according to the present invention having a CMOS configuration.

One terminal of a capacitor C for CR oscillation and for generation of a reset signal, whose the other terminal is connected to a reference potential (GND), is connected, through a terminal T and a wiring L1, to the non-inverting input terminal of a comparator 4 in a CR oscillation control circuit 2 within a semiconductor device 1, the non-inverting input terminal of a comparator 6 in a reset control circuit 3 and a charging/discharging circuit, including resistors R1, R2 and a transistor Q1, for charging and discharging the capacitor C. An output signal from the comparator 4 constitutes an internal clock (hereinafter referred to as "CLK") signal of the semiconductor device 1 through a buffer 5 and also a gate input to the transistors Q1 and Q2 to perform discharging control of an oscillating waveform. The inverting input terminal of the comparator 4 is connected through a wiring L2 to a hysteresis circuit for generating a hysteresis voltage (high level voltage: Vch and low level voltage: Vcl) for the oscillating waveform including resistors R3, R4 and R5 and the transistor Q2.

An output signal from the comparator 6 constitutes a reset (hereinafter referred to as "RST") signal for initializing the internal circuit of the semiconductor device 1 through a buffer 7 and also constitutes a gate input to a transistor Q3. The inverting input terminal of the comparator 6 is connected through a wiring L3 to a hysteresis circuit for generating a hysteresis voltage (high level voltage: Vrh and low level voltage: Vrl) for the reset control circuit 3 including resistors R6, R7 and R8 and the transistor Q3. The relationship among the hysteresis voltages is set so that Vrl<Vcl<Vrh<Vch in combination of the resistors R3 to R8.

FIGS. 2a to 2f illustrate the operation waveforms at respective positions in the embodiment of FIG. 1. Now referring to FIGS. 2a to 2f, an explanation will be given of the operation of the circuit of FIG. 1. Until a time t1 when a power supply voltage $V_{DD}$ is applied to the semiconductor device 1, the capacitor C has been discharged and remains at a reference voltage, and the wirings L1 to L3, the CLK signal and the RST signal are also at the reference voltage.

When the voltage $V_{DD}$ is applied to the semiconductor device 1 at the time t1, the voltage $V_{DD}$ is also applied to the internal circuit of the semiconductor device 1 so as to be operable. Then, in the comparators 4 and 6, the voltage at the inverting input terminal is higher than that at the non-inverting input terminal so that the output signal from each of the comparators becomes the low level. Thus, the transistors Q2 and Q3 are cut off. As a result, the hysteresis voltages in the CR oscillation control circuit 2 and the reset control circuit 3 are set to Vch and Vrh, respectively. Thereafter, with passage of time, the current flowing through the resistor R1 gradually charges the capacitor C so that the charging voltage increases. In this case, since the voltages at the inverting input terminals of the comparators are in a relation of Vch<Vrh, when the charging voltage exceeds Vrh, the RST signal is inverted into the high level to release the reset state of the semiconductor device. Then, the transistor Q3 is turned on so that the hysteresis voltage of the reset control circuit 3 becomes Vrl. When the charging voltage exceeds Vch as a result that the capacitor C is further charged, the CLK signal is inverted into the high level so that the transistors Q1 and Q2 are turned on. The hysteresis voltage of the CR oscillation control circuit 2 also becomes Vcl. Thus, the capacitor C is discharged by the current flowing through the resistor R2 (exclusive of the current flowing through the resistor R1).

When the voltage at the terminal T is lowered to Vcl as a result that the capacitor C is further discharged, the CLK signal is inverted into the low level. The transistors Q1 and Q2 are turned off again so that the hysteresis voltage of the CR oscillation control circuit 2 becomes Vch. As a result, the capacitor C is charged again by the current flowing through the resistor R1. By repeating such a charging/discharging operation, the CLK signal which is continuous will be produced. Additionally, since the hysteresis voltages at the inverting input terminals of the comparators are in a relation of Vrl<Vcl, while the oscillation continues, the RST signal will not become the low level again and hence the semiconductor device 1 will not fall in the reset state.

As described above, after the power supply of voltage is turned on, the semiconductor device operates so that the oscillation clock signal continues subsequently to releasing from the reset state. For this reason, without taking the timings of the clock signal and the reset signal into consideration, the semiconductor device can be surely operated. The semiconductor device according to this embodiment, which has a CMOS structure, can reduce the current consumption as compared with a bipolar structure.

Additionally, the values of the capacitor C and the resistor R1 must be so set that the time constant of charging/discharging is sufficiently longer than the rising time of the power supply voltage. The resistors R3 to R8 may be constituted by active resistors made of transistors, considering variations among the devices. Further, where a CR oscillator whose oscillation waveform starts from a power supply voltage is used, the hysteresis voltages may be set to satisfy a relationship of Vcl<Vrl<Vch<Vrh so as to establish the reset state at a higher voltage than the high level voltage of the oscillation waveform. A switch circuit which operates in a manner reverse to the transistor Q1 may be provided on the side of the resistor R1 to reduce the current consumption.

Figure 3:
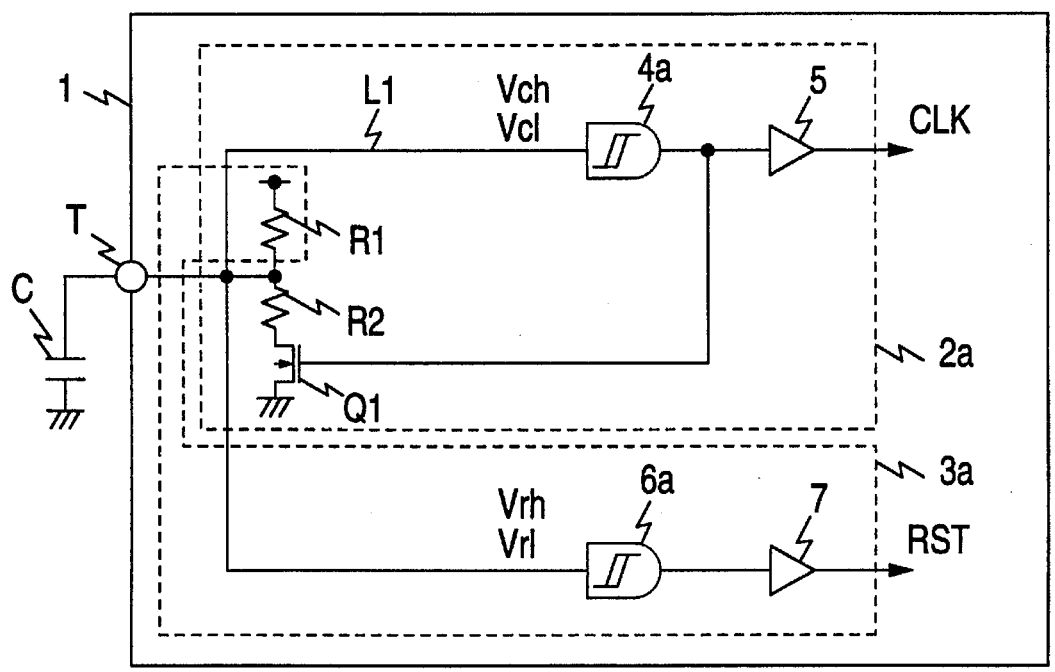
FIG. 3 is a circuit diagram showing another embodiment of the present invention.
Figure 4:
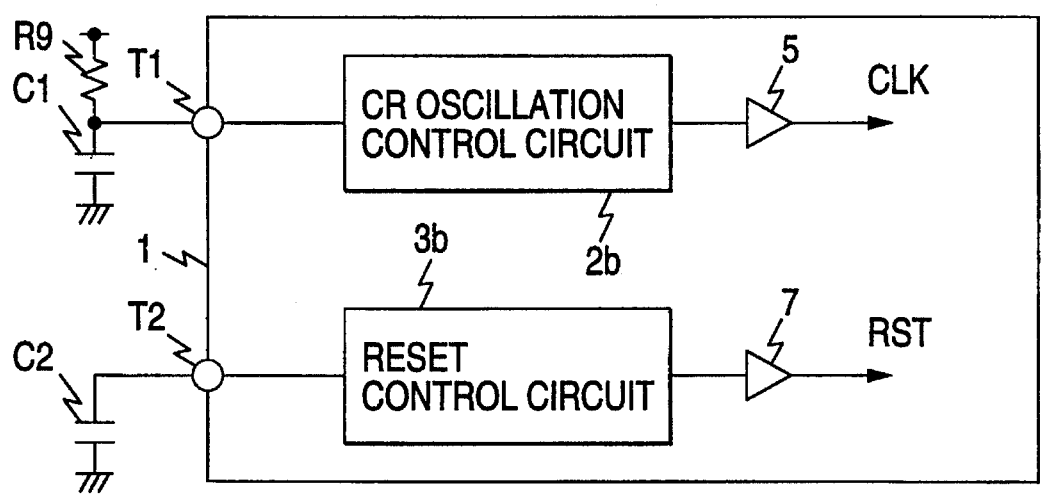
FIG. 4 is a circuit diagram showing a conventional device.

FIG. 3 shows another embodiment of the present invention. A capacitor C for CR oscillation and generation of a reset signal is connected, through a terminal T and a wiring L1, to the input terminal of a Schmitt circuit 4a in a CR oscillation control circuit 2a and the input terminal of a Schmitt circuit 6a in a reset control circuit 3a within a semiconductor device 1. The capacitor C is also connected to a charging/discharging circuit including resistors R1, R2 and a transistor Q1 for charging/discharging the capacitor C. An output signal from the Schmitt circuit 4a constitutes an CLK signal of the semiconductor device 1 through a buffer 5 and also constitutes a gate input to the transistors Q1 to perform discharging control of an oscillating waveform. An output signal from the Schmitt circuit 6a constitutes an RST signal for initializing the internal circuit of the semiconductor device 1 through a buffer 7. The hysteresis voltage of the Schmitt circuit 4a is so set by gate circuits with different input threshold voltages that the high level voltage is Vch and the low level voltage is Vcl. The hysteresis voltage of the Schmitt circuit 6a is so set by similar gate circuits that the high level voltage is Vrh and the low level is Vrl. The respective hysteresis voltages are set to satisfy a relationship Vrl<Vcl<Vrh<Vch.

The circuit operation of FIG. 3 is similar to that of FIG. 1. The circuit operation of FIG. 3, whose operation waveforms are partially common to those in FIGS. 2a to 2f, will be explained with reference to the waveforms of FIGS. 2a to 2f.

Until a time t1 when a power supply voltage $V_{DD}$ is applied to the semiconductor device 1, the capacitor C has been discharged and remains at a reference voltage and the wirings L1 to L3, the CLK signal and the RST signal are also at the reference voltage.

When the voltage $V_{DD}$ is applied to the semiconductor device 1 at the time t1, the voltage $V_{DD}$ is also applied to the internal circuit of the semiconductor device 1 so as to be operable. Then, since the voltage level at the terminal T is the reference voltage, an output signal from each of the Schmitt circuits becomes the low level so that the transistor Q1 is turned off. Thereafter, with passage of time, the current flowing through the resistor R1 gradually charges the capacitor C so that the charging voltage increases. In this case, since the input threshold voltages of the Schmitt circuits are in a relation of Vrh<Vch, when the charging voltage exceeds Vrh, the RST signal is first inverted into the high level to release the reset state of the semiconductor device 1. Then, the input threshold voltage of the reset control circuit 3s becomes Vrl. When the charging voltage exceeds Vch as a result that the capacitor C is further charged, the CLK signal is inverted into the high level so that the transistor Q1 is turned on. The input threshold voltage of the CR oscillation control circuit 2a becomes Vcl. Thus, the capacitor C is discharged by the current flowing through the resistor R2 (exclusive of the current flowing through the resistor R1).

When the voltage at the terminal T is lowered to Vcl as a result that the capacitor C is further discharged, the CLK signal is inverted into the low level. The transistor Q1 is turned off again so that the input threshold voltage of the CR oscillation control circuit 2a becomes Vch. As a result, the capacitor C is charged again by the current flowing through the resistor R1. By repeating such a charging/discharging operation, the CLK signal which is continuous will be produced. Additionally, since the input threshold voltages of the Schmitt circuits are in a relation of Vrl<Vcl, while the oscillation continues, the RST signal will not become the low level again and hence the semiconductor device will not fall into the reset state.

In combination of the circuits of FIGS. 1 and 3, the oscillation circuit and the reset circuit may be formed. However, taking the temperature characteristic of the hysteresis voltage into consideration, the same elements or devices may be used to generate the hysteresis voltages. In order to improve the accuracy of the oscillation frequency, the resistor R1 may be externally attached. Although the embodiments of the present invention were configured using a CMOS circuit, the same circuit may be constructed using a bipolar circuit.

According to the semiconductor device of the present invention, a common terminal for constituting a CR oscillator and a reset circuit can be used so that the number of terminals of the semiconductor device can be decreased to permit a larger number of functions to be included in a package having an equal number of pins, and the number of components externally equipped can be decreased to reduce expense of the components and management therefor.

What is claimed is:

1. A semiconductor device comprising:
   a CR oscillation circuit;
   a reset circuit; and
   a common terminal for constituting said CR oscillation circuit and said reset circuit,
   wherein a voltage level at which the device falls into a reset state is set to be lower than a low level voltage of an oscillation waveform to prevent the device from falling into the reset state during oscillation.

2. The semiconductor device according to claim 1, wherein a voltage level which is a reset releasing voltage of said reset circuit is set to be lower than a high level voltage of the oscillation waveform to continue oscillation after the reset state has been released.

3. The semiconductor device according to claim 1, wherein said CR oscillation circuit and said reset circuit have a CMOS configuration.

4. The semiconductor device according to claim 1, wherein one terminal of a capacitor whose the other terminal is connected to a reference potential is connected to said common terminal.

5. The semiconductor device according to claim 4, wherein said CR oscillation circuit includes a charging/discharging circuit for charging and discharging the capacitor.

6. The semiconductor device according to claim 1, wherein said CR oscillation circuit includes a comparator and a non-inverting input terminal of said comparator is connected to said common terminal.

7. The semiconductor device according to claim 6, wherein said CR oscillation circuit further includes a hysteresis circuit for generating a hysteresis voltage for the oscillation waveform and said hysteresis circuit is connected to an inverting input terminal of said comparator.

8. The semiconductor device according to claim 1, wherein said reset circuit includes a comparator and a non-inverting input terminal of said comparator is connected to said common terminal.

9. The semiconductor device according to claim 8, wherein said reset circuit further includes a hysteresis circuit for generating a hysteresis voltage for said reset circuit and said hysteresis circuit is connected to an inverting input terminal of said comparator.

10. The semiconductor device according to claim 1, wherein said CR oscillation circuit includes a Schmitt circuit and an input terminal of said Schmitt circuit is connected to said common terminal.

11. The semiconductor device according to claim 10, wherein a hysteresis voltage for said Schmitt circuit is set by gate circuits with different input threshold voltages.

12. The semiconductor device according to claim 1, wherein said reset circuit includes a Schmitt circuit and an input terminal of said Schmitt circuit is connected to said common terminal.

13. The semiconductor device according to claim 12, wherein a hysteresis voltage for said Schmitt circuit is set by gate circuits with different input threshold voltages.

14. A semiconductor device comprising:
   a CR oscillation circuit;
   a reset circuit; and
   a common terminal for constituting said CR oscillation circuit and said reset circuit,
   wherein a voltage level at which the device falls into a reset state is set to be higher than a high level voltage of an oscillation waveform to prevent the device from falling into the reset state during oscillation.

* * * * *